United States Patent [19]

Zappala

[11] 4,161,675

[45] Jul. 17, 1979

[54] LINE OUTPUT STAGE

[75] Inventor: Giuseppe Zappala, Turin, Italy

[73] Assignee: Indesit Industria Elettrodomestici Italiana S.p.A., Turin, Italy

[21] Appl. No.: 855,308

[22] Filed: Nov. 28, 1977

[30] Foreign Application Priority Data

Nov. 26, 1976 [IT] Italy .................. 69821 A/76

[51] Int. Cl.² .......................................... H01J 29/56
[52] U.S. Cl. .................................. 315/371; 315/408
[58] Field of Search ................ 315/408, 399, 410, 371

[56] References Cited
U.S. PATENT DOCUMENTS 3,906,305  9/1975  Nillesen ..................... 315/407 X

FOREIGN PATENT DOCUMENTS 2408301  9/1974  Fed. Rep. of Germany ........... 315/408

Primary Examiner—Theodore M. Blum
Attorney, Agent, or Firm—Lerner, David, Littenberg & Samuel

[57] ABSTRACT

A line output stage comprising a first parallel resonant circuit including a horizontal deflection coil and a capacitor, one side of the first resonant circuit being connected to ground and the other side of the first resonant circuit being returned to ground by way of a first diode and a controllable semi-conductor switch, a second diode connected in parallel with the first resonant circuit, a second parallel resonant circuit comprising a second coil having one side connected to a DC power supply terminal and the other side returned to ground by way of the controllable semi-conductor switch, means for applying periodic pilot pulses to the controllable semi-conductor switch and an energy transfer circuit inductively or capacitatively coupled to the said second parallel resonant circuit for transferring energy during each cycle from the second parallel resonant circuit to the first parallel resonant circuit, the said energy transfer circuit including a third diode and means for modulating the power transferred by way of the said diode to the first parallel resonant circuit during each saw tooth cycle.

7 Claims, 4 Drawing Figures

LINE OUTPUT STAGE

The present invention relates to a line output stage for driving a saw-tooth current in a horizontal delfection coil, and is particularly related to a line output stage in which the saw-tooth current may be modulated to vary from one cycle to the next.

There is known from German Auslegeschrift No. 2403331 a line output stage in which the deflection coil forms part of a parallel resonant circuit connected in parallel with one of two diodes which form a series combination connected in reverse parallel with a transistor constituting a controllable switch. A second parallel resonant circuit is connected across the second diode of the series combination and a transistor is provided for applying a modulation voltage to the coil of the second resonant circuit. In the circuit described in U.S. Pat. No. 3,906,305, the two oscillatory circuits must have the same tuned frequency and they are arranged in series with one another so that the sum of the voltages applied to the deflection coil and the coil of the second resonant circuit is independent of the modulation voltage applied to the coil of the second resonant circuit. This circuit has a number of drawbacks, two of which are that the deflection coil is usually ground insulated and the two tuned frequencies must be the same, a feature which makes the circuit very rigid.

The present invention seeks to mitigate the foregoing disadvantages.

According to the present invention there is provided a line output stage comprising a first parallel resonant circuit including a horizontal deflection coil and a capacitor, one side of the first resonant circuit being connected to ground and the other side of the first resonant circuit being returned to ground by way of a first diode and a controllable simi-conductor switch, a second diode connected in parallel with the first resonant circuit, a second parallel resonant circuit comprising a second coil having one side connected to a DC power supply terminal and the other side returned to ground by way of the controllable semi-conductor switch, means for applying periodic pilot pulses to the controllable semi-conductor switch and an energy transfer circuit inductively or capacitatively coupled to the said second parallel resonant circuit for transferring energy during each cycle from the second parallel resonant circuit to the first parallel resonant circuit, the said energy transfer circuit including a third diode and means for modulating the power transferred by way of the said diode to the first parallel resonant circuit during each saw tooth cycle.

The invention will now be described further, by way of example, with reference to the accompanying drawings, in which.

Figure 1:
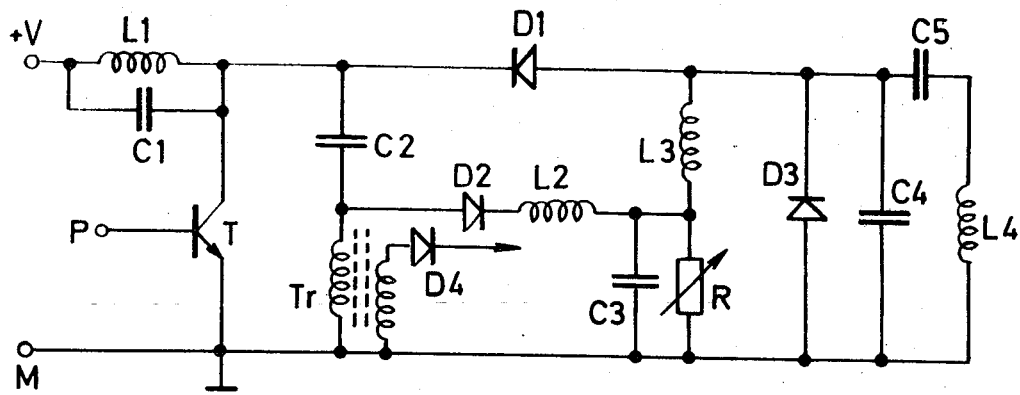
FIG. 1 shows the circuit diagram of a line output stage for a television set.

FIG. 1 shows the circuit diagram of a line output stage for a television set. The circuit is particularly suitable for colour television sets requiring horizontal deflection amplitude modulation such as vertical-frequency modulation for the so-called EAST-WEST correction of cushion distortion, as is the case on recent in-line-gun tubes and self-convergent yokes (such as PHILIPS 20-AX or RCA Precision In-Line types).

FIG. 1 shows two supply terminals +V and M, the latter being connected to ground.

Terminal +V is connected to an inductor L1 parallel to which is connected a capacitor C1. These two components form a parallel resonant circuit, connected on one side to terminal +V and on the other to:

the collector of a power transistor T for line deflection (e.g. Philips BU208); the cathode of diode D1; and one plate of a capacitor C2. The emitter of transistor T is connected to ground and its base is connected to a terminal P to which a suitable pilot signal is taken to be applied in the known way (which is not shown).

The other plate of capacitor C2 is connected to ground through the primary of transformer TR as well as being connected to the anode of a diode D2. Transformer TR may have one or more secondaries (only one is shown in the Figure) and supply other circuits or loads on the set through diodes (one, D4, is shown in the Figure). For example, one of the secondaries may be used for providing E.H.T. for the tube.

The cathode of diode D2 is connected by way of an inductance coil L2 to an equalizing condenser C3, the other plate of which is grounded, and to an inductance coil L3 and a variable load R. This variable load may be a modulator for modulating horizontal deflection amplitude, for example, under the control of the vertical deflection stage.

The other end of coil L3 is connected to the anode of diode D1 as well as to the cathode of a further diode D3 and two capacitors C4 and C5.

Capacitor C4, which determines the horizontal deflection retrace interval, has its other plate connected to ground. Capacitor C5, which is the trace interval or S correction capacitor, is connected at the other end to the line deflection coil L4 which, in turn, is connected at the other end to ground.

The following table shows typical values for the circuit components shown in FIG. 1:

| | |
|---|---|
| Coil L1 | 4 mH |
| Coil L2 | 4 mH |
| Coil L3 | 4 mH |
| Coil L4 | 1.2 mH |
| Capacitor C1 | 8 nF |
| Capacitor C2 | 0.56 $\mu$F |
| Capacitor C3 | 2.7 $\mu$F |
| Capacitor C4 | 13 nF |
| Capacitor C5 | 0.56 $\mu$F |
| Transformer TR primary | 7 mH |

The operation of the circuit shown in FIG. 1 will now be described with reference to FIGS. 2A to 2F which show the graphs of a number of voltages and currents in the FIG. 1 circuit.

FIG. 2A shows the graphs of voltage VT on the collector of transistor T and voltage VD3 on the cathode of diode D3.

FIG. 2B shows the graph of the current IT through the collector of transistor T.

FIG. 2C shows the graph of current ID1 in diode D1.

FIG. 2D shows the graph of current ID3 in diode D3.

FIG. 2E shows the graph of current ID2 in diode D2, and

FIG. 2F shows the current through the deflection coil L4.

As can be seen, the time axis is marked out with 8 successive instants ($t_0 \ldots t_7$).

The interval between $t_0$ and $t_7$ corresponds to a complete line cycle (64 μsec.).

Ignoring, for the time being, the diode D2 and load R.

Figure 2:
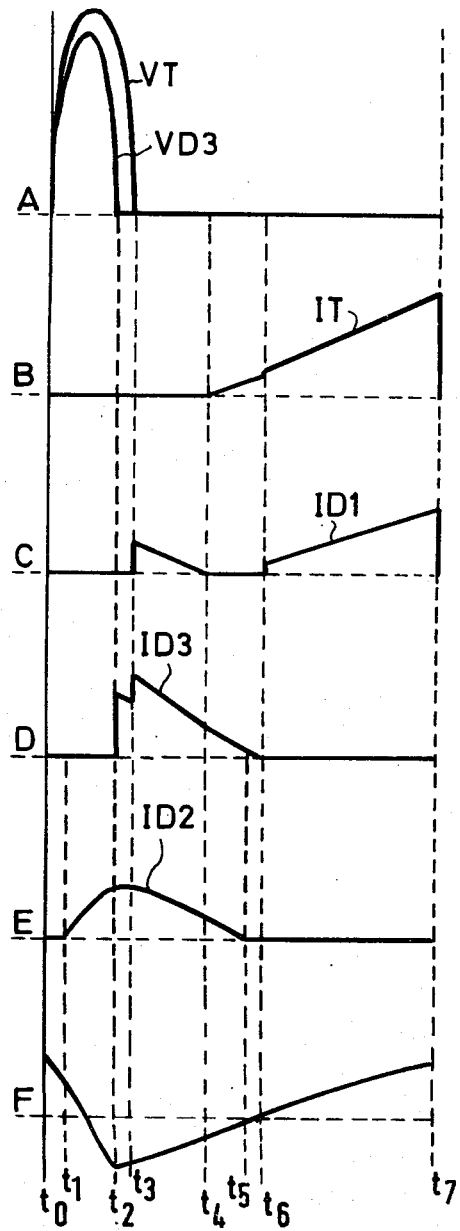
FIGS. 2A to 2F show the voltage and current waveforms at various points in the circuit of FIG. 1.

During the interval $t_0$-$t_2$ no semi-conductors are conductive; circuit L4-C4 oscillates freely (curve VD3 in FIG. 2-A) as does circuit L1-C1 (curve VT in FIG. 2A).

At $t_2$ the voltage at the terminals of L4 is inverted which causes D3 to be made conductive (see FIG. 2A).

From $t_2$ to $t_3$ deflection curent flows in D3 while circuit L1-C1 continues to oscillate freely until it completes a half-cycle.

At $t_3$ the voltage at the terminals of L1 is inverted which causes D1 to become conductive and the current to rise through D3 (FIG. 2C and 2D).

From $t_3$ to $t_4$, D1 and D3 are both conductive. Between $t_2$ to $t_4$ base current is applied to transistor T but the transistor does not conduct as a reverse bias is applied across the emitter collector.

At $t_4$ the current in D1 reaches zero and reverses, which causes transistor T to be made conductive (FIG. 2B).

From $t_4$ to $t_6$, therefore, both diode D3 and transistor T are conducting.

At $t_6$ the current in D3 reaches zero (FIG. 2D) and is inverted which causes diode D1 to be made conductive once more (FIG. 2C).

From $t_6$ to $t_7$, both diode D1 and transistor are conducting.

At $t_7$ transistor T is disabled by the pilot pulse applied to its base which causes diode D1 to be opened too and a new retrace interval is started ($t_7 - t_0$). The circuit shown in FIG. 1 has two oscillating circuits (L1-C1 and L4-C4) which have different times and are both free—oscillating when transistor T is disabled. It goes without saying that the resonance frequencies depend also on the components connected parallel to these two circuits.

Considering now the circuit section consisting of parts D2, L2, C3, R and L3. The purpose of this section is to act as an energy transfer circuit to put back into the deflection circuit energy dissipated as a result of losses and to maintain oscillation. FIG. 2E shows that diode D2 starts conducting not long after $t_0$, that is, as soon as the voltage at the terminals of TR exceeds that at the terminals of C3. It carries on conducting up to $t_5$, roughly half way through the scanning trace interval and until the energy accumulated in L2 has flowed into C3. C3 then supplies the horizontal deflection circuit (L4-C5-C4) through L3 and directly supplies load R.

Obviously, if resistance R is reduced, more energy will be supplied to R from C3 and less to circuit L4-C5-C4.

In fact, a reduction of R has the following effects:
voltage VD3 falls;
currents IT, ID1 and ID3 fall;
current ID2 increases;
the interval $t_2$-$t_4$ increases ($t_4$ is delayed);
the interval $t_6$-$t_7$ increases ($t_6$ is brought forward);
the interval $t_1$-$t_5$ increases ($t_5$ is delayed).

There is no noticeable effect on:
VT;
the current absorbed by the +V supply;
times $t_0$-$t_2$ and $t_0$-$t_3$.

By means of the circuit shown in FIG. 1, horizontal deflection current can be varied within a wide range without affecting the remaining circuits of the set supplied by transformer TR and, in particular, the value of the E.H.T. value.

Resistance R is usually a controllable component such as a transistor or, more usually, an absorption modulator.

The main advantages of the invention described over known circuits can be summed up as follows:
both the deflection coil and the E.H.T. transformer are grounded;
the turned frequencies of the deflection and E.H.T. circuits are independent and may even be different;
the modulator may be a passive load and practically operates at a point free from line-frequency voltages.

Figure 3:
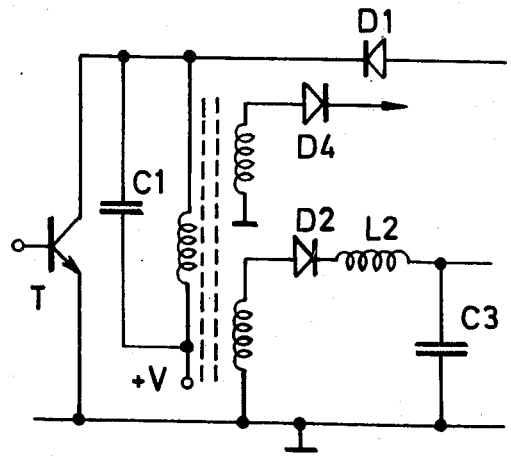
FIG. 3 shows a variation of the FIG. 1 circuit.

It is possible to combine L1 and the primary of TR into a single transformer so as to eliminate C2. In this case, a secondary of the transformer will be connected to D2. Such an embodiment is shown in FIG. 3. Another advantage is that, by using different tuned frequencies, in particular by making the tuned frequency of L1-C1 smaller than L4-C4, a low supply voltage as compared with the +V voltage is obtained at the terminals of C3 which makes circuit design even more versatile.

Figure 4:
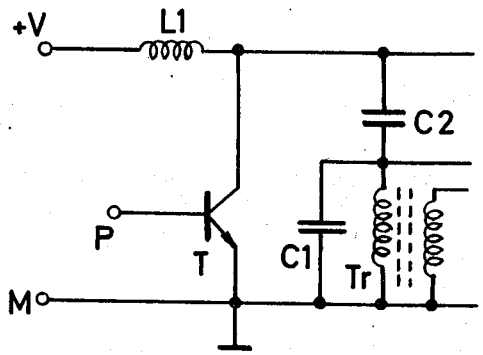
FIG. 4 shows a part of a circuit which corresponds to the left hand part of the circuit of FIG. 1, illustrating a modification.

Furthermore, as shown in FIG. 4, the capacitor C1 may alternatively be connected in parallel with the primary winding of the transformer TR without changing the operation of the ciicuit.

I claim:

1. A line output stage for providing a cyclic line saw tooth signal comprising a first parallel resonant circuit including a horizontal deflection coil and a first capacitor, one side of the first parallel resonant circuit being connected to ground and the other side of the first parallel resonant circuit being returned to ground by way of a first diode and a controllable semiconductor switch which controls the cycle of said cyclic line saw tooth signal; a second diode connector in parallel with the first parallel resonant circuit, a second parallel resonant circuit comprising a second capacitor and a second coil having one side for connection to a D.C. power supply and the other side returned to ground by way of the controllable semi-conductor switch; and an energy transfer circuit coupled to the second parallel resonant circuit for transferring energy during each saw tooth cycle from the second parallel resonant circuit to the first parallel resonant circuit, the energy transfer circuit including a third diode and means for modulating at vertical frequency the power transferred which is capable of adjusting said power transferred during each horizontal saw tooth cycle.

2. A line output stage as claimed in claim 1 in which the third diode is connected to the said first parallel resonant circuit by way of at least one inductance coil.

3. A line output stage as claimed in claim 1, wherein the first and second parallel resonant circuits have different tuned frequencies.

4. A line output stage as claimed in claim 3, in which the third diode is connected to the said first parallel resonant circuit by way of at least one inductance coil.

5. A line output stage as claimed in claim 3, wherein the tuned frequency of the second parallel resonant circuit is less than that of said first parallel resonant circuit.

6. A line output stage as claimed in claim 5, in which the third diode is connected to the said first parallel resonant circuit by way of at least one inductance coil.

7. A line output stage for providing a cyclic line saw tooth signal comprising a first parallel resonant circuit including a horizontal deflection coil and a first capacitor, one side of the first parallel resonant circuit being connected to ground and the other side of the first parallel resonant circuit being returned to ground by way of a first diode and a controllable semi-conductor switch which controls the cycle of said cyclic line saw tooth signal; a second diode connected in parallel with the first parallel resonant circuit; an inductor for connecting the controllable semi-conductor switch to a D.C. power supply, a second parallel resonant circuit comprising a second capacitor and a second coil having one side connected to ground and the other side returned to ground by way of the controllable semi-conductor switch, and an energy transfer circuit coupled to the second parallel resonant circuit for transferring energy during each saw tooth cycle from the second parallel resonant circuit to the first parallel resonant circuit, the energy transfer circuit including a third diode and means for modulating at vertical frequency the power transferred which is capable of adjusting said power transferred during each horizontal saw tooth cycle.

* * * * *

UNITED STATES PATENT AND TRADEMARK OFFICE
CERTIFICATE OF CORRECTION

PATENT NO. : 4,161,675
DATED : July 17, 1979
INVENTOR(S) : Giuseppe Zappala

It is certified that error appears in the above-identified patent and that said Letters Patent are hereby corrected as shown below:

Column 4, line 38 the word "connector" should read --connected--.

Signed and Sealed this

Sixth Day of November 1979

[SEAL]

Attest:

RUTH C. MASON
Attesting Officer

LUTRELLE F. PARKER
Acting Commissioner of Patents and Trademarks